US006547946B2

(12) United States Patent
Meltzer et al.

(10) Patent No.: US 6,547,946 B2
(45) Date of Patent: Apr. 15, 2003

(54) PROCESSING A PRINTED WIRING BOARD BY SINGLE BATH ELECTRODEPOSITION

(75) Inventors: Michael P. Meltzer, Oakland, CA (US); Christopher P. Steffani, Livermore, CA (US); Ray A. Gonfiotti, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 18 days.

(21) Appl. No.: 09/810,877

(22) Filed: Mar. 16, 2001

(65) Prior Publication Data

US 2001/0050179 A1 Dec. 13, 2001

Related U.S. Application Data

(60) Provisional application No. 60/195,479, filed on Apr. 10, 2000.

(51) Int. Cl.[7] ............................. C25D 5/12; C25D 5/10
(52) U.S. Cl. ........................................ 205/181; 205/182
(58) Field of Search ............................... 205/181, 182, 205/105; 427/96, 404, 255.7

(56) References Cited

U.S. PATENT DOCUMENTS

| | | | |
|---|---|---|---|
| 3,770,571 A | 11/1973 | Alsberg et al. ............ 161/217 |
| 4,487,654 A | 12/1984 | Coppin ....................... 156/645 |
| 4,652,348 A | * 3/1987 | Yahalom et al. .............. 204/40 |
| 5,052,103 A | 10/1991 | Saitou ........................ 29/852 |
| 5,320,719 A | * 6/1994 | Lasbmore et al. .......... 205/104 |

FOREIGN PATENT DOCUMENTS

JP   11-103164 A   * 4/1999

OTHER PUBLICATIONS

Despic et al., "Electrochemical Formation of Laminar Deposits on Controlled Structure and Composition", J. Chem. Soc., vol. 136, No. 6, Jun. 1999, pp. 1651–1657.*

* cited by examiner

*Primary Examiner*—Edna Wong
(74) *Attorney, Agent, or Firm*—Eddie E. Scott; Alan H. Thompson

(57) ABSTRACT

A method of processing a printed wiring board by single bath electrodeposition. Initial processing steps are implemented on the printed wiring board. Copper is plated on the printed wiring board from a bath containing nickel and copper. Nickel is plated on the printed wiring board from the bath containing nickel and copper and final processing steps are implemented on the printed wiring board.

27 Claims, 3 Drawing Sheets

PROCESSING A PRINTED WIRING BOARD BY SINGLE BATH ELECTRODEPOSITION

CROSS-REFERENCE TO RELATED APPLICATIONS

This application claims the benefit of U.S. Provisional Application No. 60/195,479, filed Apr. 10, 2000, entitled "Use of Layered Plating Techniques in Printed Circuit Board Manufacture," which is incorporated herein by this reference.

SINGLE BATH ELECTRODEPOSITION

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of Endeavor

The present invention relates to printed wiring boards and more particularly to a single bath electrodeposition system.

2. State of Technology

U.S. Pat. No. 3,770,571 for fabrication of printed circuit boards by Henry Alsberg and Ronald A. Frederiksen, patented Nov. 6, 1973, provides the following statements, "printed circuit boards have become an important commercial form of circuits for the electronic industry. In general, they comprise a metal coating in a particular design representing a circuit or circuits attached either directly or indirectly (i.e., by adhesives) to the surface or surfaces of an electrically nonconductive substrate. Often the substrate is rigid as in reinforced epoxies, although it can also be flexible as in polyester films."

U.S. Pat. No. 4,487,654 for a method of manufacturing printed wiring boards by James A. Coppin, patented Dec. 11, 1984, provides the following description, "FIG. 2 is a table showing a sequence of process steps which may be followed in manufacturing a printed circuit board . . . . In the following description, necessary art work for and conventional steps of FIG. 2 that are normally used in the manufacture of a printed circuit board are not described in detail since they are well known in the prior art . . . . Holes are drilled through substrate in a prescribed hole pattern (step 101) [not shown] and a thin layer of copper is chemically deposited on one or both sides of the substrate and walls of the holes to make them electrically conductive (step 102) [not shown]. Alternatively, the substrate may have 1 ounce copper cladding bonded to one or both sides thereof prior to drilling component holes and chemically depositing a thin layer of copper on the board and the walls of the holes (step 102) for making them conductive. One ounce copper refers to a copper foil that weighs one avoir ounce per square foot and has a nominal thickness of 0.0014". A relatively thick layer of plating resist is then applied over the full surface areas of the copper in a negative image of the desired electrical circuit pattern . . . . After appropriate curing of the plating resist, an additional layer of copper is electroplated onto the exposed areas of copper to build them up to the full-required thickness, as dictated by electrical circuit requirements . . . . In accordance with one aspect of this invention, a very thin coating of tin-lead solder alloy is then deposited on the exposed copper surfaces of the board. The coating has a thickness which is sufficient to effectively operate as a metallic etch resist for the cropper that it covers, but which is thin enough that it will not melt and flow detrimentally during a subsequent wave soldering operation. By not flowing detrimentally, it is meant that any flow of tin-lead solder will be insufficient to cause bridging or wrinkling and/or rupture of a solder mask on top of it. It is believed there is no melting or flowing of the coating, but there appears to be a sintering of the solder into the copper traces during a subsequent reflow operation or wave solder operation. The composition of the tin-lead alloy is at least similar to and is preferably the same as that used in the subsequent wave soldering operation. By way of example, the solder of layer may be 63% tin and 37% lead. The thin coating is preferably electroplated onto the copper in order to more precisely control the thickness thereof . . . . A second layer of plating resist is then deposited over the first layer of plating resist and areas of the circuit pattern other than terminal pads and component holes, the latter requiring a relatively thick coating of solder to ensure good solderability of circuit components in a subsequent wave soldering operation. This second layer of plating resist is readily applied using the already existing art work for the solder mask. After cleaning and activating the exposed-thin area of tin-lead solder alloy in and around the holes, the thick layer of tin-lead is built up by electroplating to a desired thickness in the area of 0.300 to 0.500 milli-inches. The composition of the solder plating used in this electroplating operation may also be the same as that used in the subsequent wave solder operation. Both of the layers of plating resist are now chemically stripped from the board. In order to remove excess copper which is not part of a desired electrical circuit pattern, the board is then immersed in or sprayed with an etchant solution for removing copper that is not covered and protected by the tin-lead overplatings which operate as an etch to the copper under them. The etchant is selected to be one that has little affect on the tin-lead alloy but which readily dissolves copper. In accordance with another aspect of this invention, the circuit board is next cleaned, rinsed, acid dipped, rinsed and then mechanically-abrasively scrubbed for cleaning and roughening the surface of and reducing the thickness of the thin layer of tin-lead (step 110) [not shown]. The mechanical scrubber may be a conventional commercially available machine such as the model 107, which is manufactured by CHEMCUT and may have an integral drying facility. Abrasive rollers of the scrubber should be cleaned periodically so that they do not contaminate the surface of the board. It is not necessary for the thin layer of tin-lead to be completely removed from the copper. Preferably the abrasive scrubbing cleans and roughens the surface of the solder coating, and only removes surface amounts of that solder. Rather, it is preferable that the copper traces under the coating not be exposed since this introduces a cosmetic defect. Additionally, such an amount of scrubbing may damage the copper traces since it has been found that the solder coating actually sinters or soaks into or amalgamates with the copper under it during a subsequent reflow operation. In practice, it has been found that a thin layer of tin-lead may actually be left on the board, omitting the scrubbing operation, without serious adverse affects. In accordance with a further aspect of this invention, a solder mask of a solder-resist is then applied to the surface of the board. The solder mask is preferably applied subsequent to heating of the board for eliminating any moisture left on it during cleaning and prior to reflow or fusing of the thick-tin-lead layer. The mask itself is conventional and is applied in the desired thickness and cured in the manner well known in the prior art. The solder mask provides an overall printed wiring board that is esthetically pleasing and is a conformalprotective coating. The solder mask is preferably applied prior to reflow so that if fusing is accomplished by dipping the board in a hot oil bath, then oil and other contaminants will not be located on the areas of the board that are subsequently to be coated with solder-resist. In this sequence of operations, the solder mask also prevents bridging during wave soldering, reduces the solder content and spiking in large ground plane areas, and prevents cross over between closely spaced circuit traces. Also, this sequence of processing causes the solder mask to bond more firmly to the circuit board. Finally, the tin-lead overplating in the areas of the holes and contacts is fused by exposing the board to a sufficiently high temperature in the conventional manner (step 112) [not shown]. This fusing provides a shiny surface to the layer and eliminates deformities such as striations in the solder layer which may be subsequently contaminated by oil from the fingers of a human operator. Following the reflow operation, conventional fabrication operations are completed and then the completed printed wiring board is stored until it is loaded with components which may be attached thereto by a wave solder operation. The disclosure of U.S. Pat. No. 4,487,654 to James A. Coppin, patented Dec. 11, 1984, is incorporated herein by reference.

U.S. Pat. No. 5,052,103 for a method of manufacturing printed wiring board having no copper migration by Hideo Saitou and Kabushiki Kaisha Sharp patented Oct. 1, 1991 provides the following description, "A method of manufacturing a printed wiring board includes a step of providing a plurality of pierced holes in prescribed positions of a laminate which is formed by adhering electrolytic conductive metal foils on front and rear surfaces of a laminate mainly composed of resin, a step of dipping the laminate completely provided with the pierced holes in unhardened liquid thermosetting resin, a step of removing excessive parts of the thermosetting resin applied onto the front and rear surfaces of the laminate and inner peripheral walls surfaces of the pierced holes, a step of heating and hardening the applied thermosetting resin, a step of removing parts of the thermosetting resin hardened on the conductive metal foils provided on the front and rear surfaces of the laminate, and a step of forming plating layers of a conductive metal on the front and rear surfaces of the laminate and the inner peripheral wall surfaces of the pierced holes. A printed wiring board having an excellent insulation property between through-holes can be manufactured through the aforementioned steps."

SUMMARY OF THE INVENTION

The present invention provides a method of processing a printed wiring board. Initial processing steps are implemented on the printed wiring board. Copper is plated on the printed wiring board from a bath containing nickel and copper. Nickel is plated on the printed wiring board from a bath containing nickel and copper and the final processing steps are implemented on said printed wiring board.

A printed wiring board is produced by implementing initial processing steps on the printed wiring board. Copper is plated on the printed wiring board from a bath containing nickel and copper. Nickel is plated on the printed wiring board from a bath containing nickel and copper and the final processing steps are initiated on the printed wiring board.

In an embodiment of the present invention plating of copper on the printed wiring board from a bath containing nickel and copper is conducted using a low reduction potential and is conducted with high agitation conditions in the bath. Plating of nickel on the printed wiring board from a bath containing nickel and copper is conducted using a high reduction potential and with low agitation conditions in the bath.

Other features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description and by practice of the invention.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
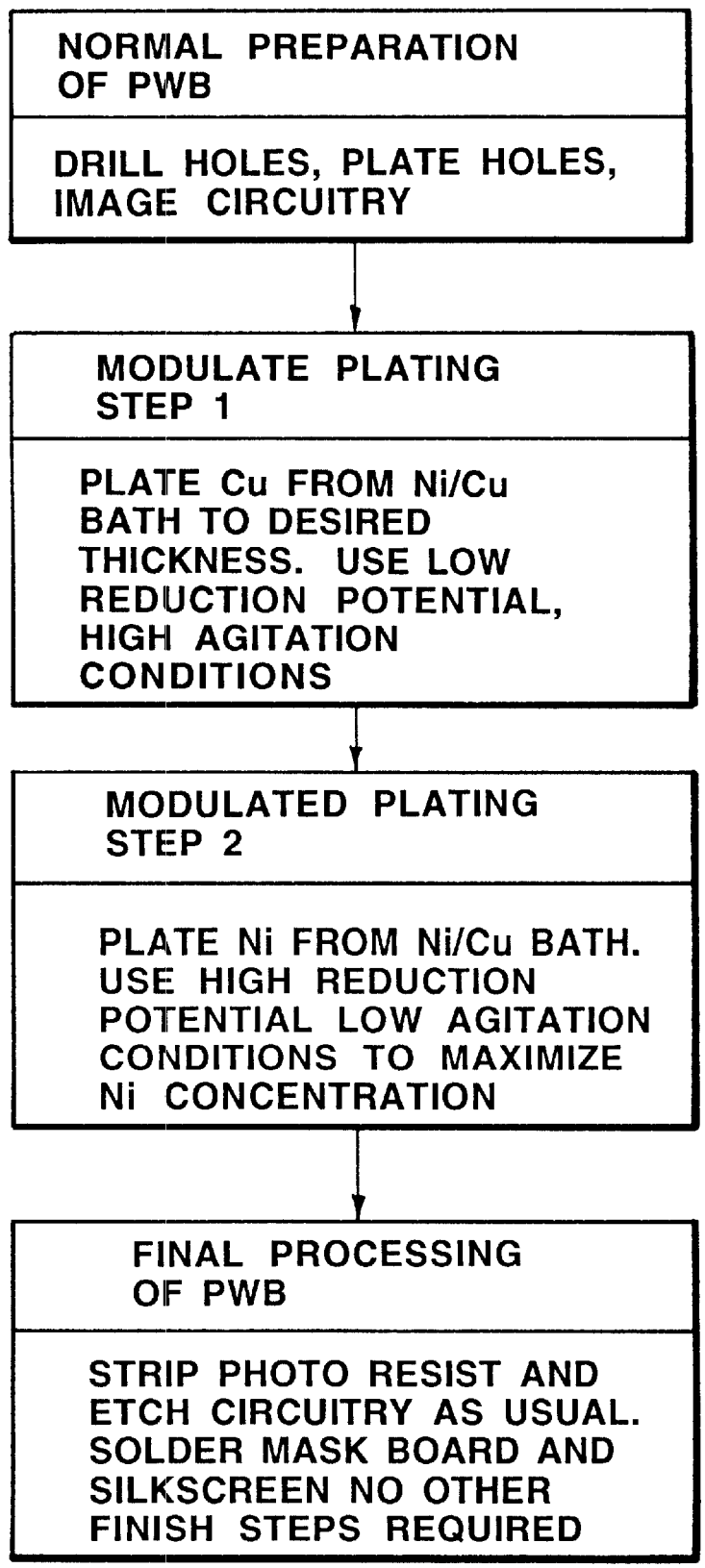
FIG. 1 illustrates the modulated plating process flow of the present invention.

Referring now to the drawings, specific embodiments of the invention are shown. The detailed description of the specific embodiments, together with the general description of the invention, serve to explain the principles of the invention.

Hot-air solder leveling (HASL), the most common method of finishing printed wiring boards (PWBs), is one of the main uses of lead in traditional PWB manufacturing. Unfortunately, the HASL technology includes some environmental and human health risks. One of the major risks associated with printed wiring board (PWB) manufacture is the use of lead. Replacing or simplifying HASL will lead to both employee health and environmental benefits. In addition, there is a production advantage to eliminating or simplifying HASL, for it provides a fairly uneven surface that is problematic for mounting very small components.

The printed wiring board industry has low profit margins on many of its products. In the PWB process the "footprint," the total shop floor area needed for the process determines some of overall cost of the process. The footprint area is an important limiting factor of production, and new technologies that even modestly reduce the footprint size can be very valuable.

"Single Bath Electrodeposition" technology, the present invention, is an alternative approach for manufacturing PWBs that offers significant environmental and cost advantages over present methods. In particular, the single bath plating technology can eliminate the use of lead metal, an extremely toxic material, from several PWB manufacturing steps. The technology can also reduce the use of other problematic chemicals and can shorten the manufacturing process, rendering it simpler, more efficient and profitable.

Single bath electroplating was investigated as a potential HASL replacement technology for many applications. Single-bath electroplating involves alternating deposition of one or the other metal component of a bimetal bath, through control of plating potential and mass transport. It employs a nickel layer as both etch resist and finish coat and has the potential for lowering environmental and human-health risks associated with PWB manufacture—while at the same time reconfiguring the process for greater efficiency and profitability. The layered plating technology is based on deposition of either of two metals, copper or nickel, from the same plating bath. Through control of bath chemistry and rectification, the particular metal to be deposited can be selected.

Referring now to FIG. 1 an embodiment of the single bath plating process of the present invention is shown. A printed wiring board is processed using the four overall processing operations shown in FIG. 1. The four processing operations are (1) Normal Preparation of PWB, (2) Single Bath Plating Step 1, (3) Single Bath Plating Step 2, and (4) Final Processing of PWB. The "Normal Preparation of PWB" processing operation generally includes drilling holes, plating holes, and depositing the photoresist image circuitry. The "Single Bath Plating Step 1" processing operation involves plating Cu on the printed wiring board from a Ni/Cu bath using a low reduction potential with high agitation conditions in the bath. The "Single Bath Plating Step 2" involves plating Ni on the printed wiring board from a Ni/Cu bath using a high reduction potential with low agitation conditions in the bath. The "Final Processing of PWB" includes stripping the photoresist, etching away unwanted copper, applying a solder mask, cleaning and labeling the PWB. Hot air solder leveling, as well as stripping the etch resist layer are operations that have been eliminated.

In the single bath method, copper is plated first, to the desired thickness of the PWB's circuitry (typically about 1 mil (0.001 inch)). After this, a nickel layer is deposited as an "etch resist" to protect the copper circuitry. This layer is left in place rather than stripped (as etch resists generally are) and serves as a finish coat to the board, onto which components are soldered. Tests demonstrated that this nickel layer, which contains a percentage of copper due to the chemistry of the process, provides a good solderable surface.

Production advantages of the embodiment present invention arise from the elimination of several steps in the manufacturing process:
1) The deposition of copper circuit traces and of the etch resist layer are combined into one operation. Any need for rinsing between these two steps is also eliminated.
2) The nickel etch resist layer does not have to stripped, eliminating a costly, labor intensive operation that also generates significant hazardous waste. The tin and tin-lead etch resists currently used are not suitable to be left in place, but the nickel is durable and stable enough to remain on the PWB.
3) Hot Air Solder Leveling (HASL), the most common finish coat on PWBs, is no longer needed, since the nickel serves as both an etch resist and a finish coat.

HASL is one of the main uses of lead in traditional PWB manufacturing, and thus its elimination has both production and environmental advantages. The layered PWB plating technology was adapted from layered electroforming techniques used to build up copper-nickel composite materials of high tensile strength. These materials typically had many alternating, very thin layers of each metal.

In development of the system of the embodiment present invention techniques were adapted from layered electroforming methods that are used to build up copper-nickel composite materials of high tensile strength. These materials typically have many alternating, extremely thin layers of each metal. The electroforming process parameters were altered so that the thicker layers of copper required for PWB circuitry could be deposited.

The system of the embodiment present invention changed the plating parameters of previous layered plating technologies as to be able to plate much thicker layers of copper (typically 0.5 to 1 mil), which are required for PWBs. In addition, the system of the present invention meets PWB manufacturing requirements for producing level, bright, durable deposits, and generating a nickel layer that can be readily soldered to. To accomplish these objectives, bath chemistry and rectification needed to be modified from existing layered plating methodologies.

The single-bath process generates copper deposits from a very dilute solution of copper ions (0.05–0.1 M), versus 2.0 M for traditional PWB applications. In the single-bath approach, nickel concentrations are an order of magnitude greater than those of copper, and special complexing agents are used to modify reduction potentials. Solution pH is also controlled very closely. Amperometric manipulation is performed concurrently with agitation variations to insure the deposition of distinct layers of copper and nickel. Copper thicknesses on the order of 12 microns (0.0005") and nickel thicknesses of 1 micron (0.00004") are achieved by this approach.

Single-bath electroplating is applied to PWB fabrication. Copper is plated first, to the desired thickness of the PWB's circuitry—typically 12 microns (0.0005"). Next, a nickel layer is deposited as an etch resist to protect copper circuitry. The etch-resist layer is left in place rather than stripped (as tin and tin/lead etch resists generally are) and serves as a finish coat for the PWB, onto which components are soldered. Analyses demonstrated that this nickel layer, which contains a significant percentage of copper because of the chemistry of the process, provides a good solderable surface.

The system of the embodiment present invention (1) meets PWB-manufacturing requirements for level, bright, durable deposits and for a solderable nickel layer; (2) eliminates a costly, labor-intensive operation that also generates significant hazardous waste, because our nickel etch-resist layer does not have to stripped and discarded; (3) eliminates use of highly toxic lead-bearing materials from several PWB manufacturing steps—including etch-resist deposition, finish coating, and tinning; and (4) by combining several fabrication steps into one tank—that is, by depositing either copper (for circuitry) or nickel (for an etch-resistant finish) from the same bath without intermediate rinsing—can reduce equipment requirements and the floor space needed for manufacturing PWBs.

The technology consists of an electrolytic process for the preferential deposition of copper or nickel metal from a bath containing copper sulfate (0.05–0.5 N), nickel sulfate (0.5–2.ON), sodium citrate (0.5–2.ON), and certain organic compounds (0–2 vol.°/using DC and/or modulated DC waveforms. The process produces an electrically conductive copper layer topped with a nickel layer that is readily solderable and resistant to corrosion in ammoniacal cupric chloride etching solutions.

Figure 2:
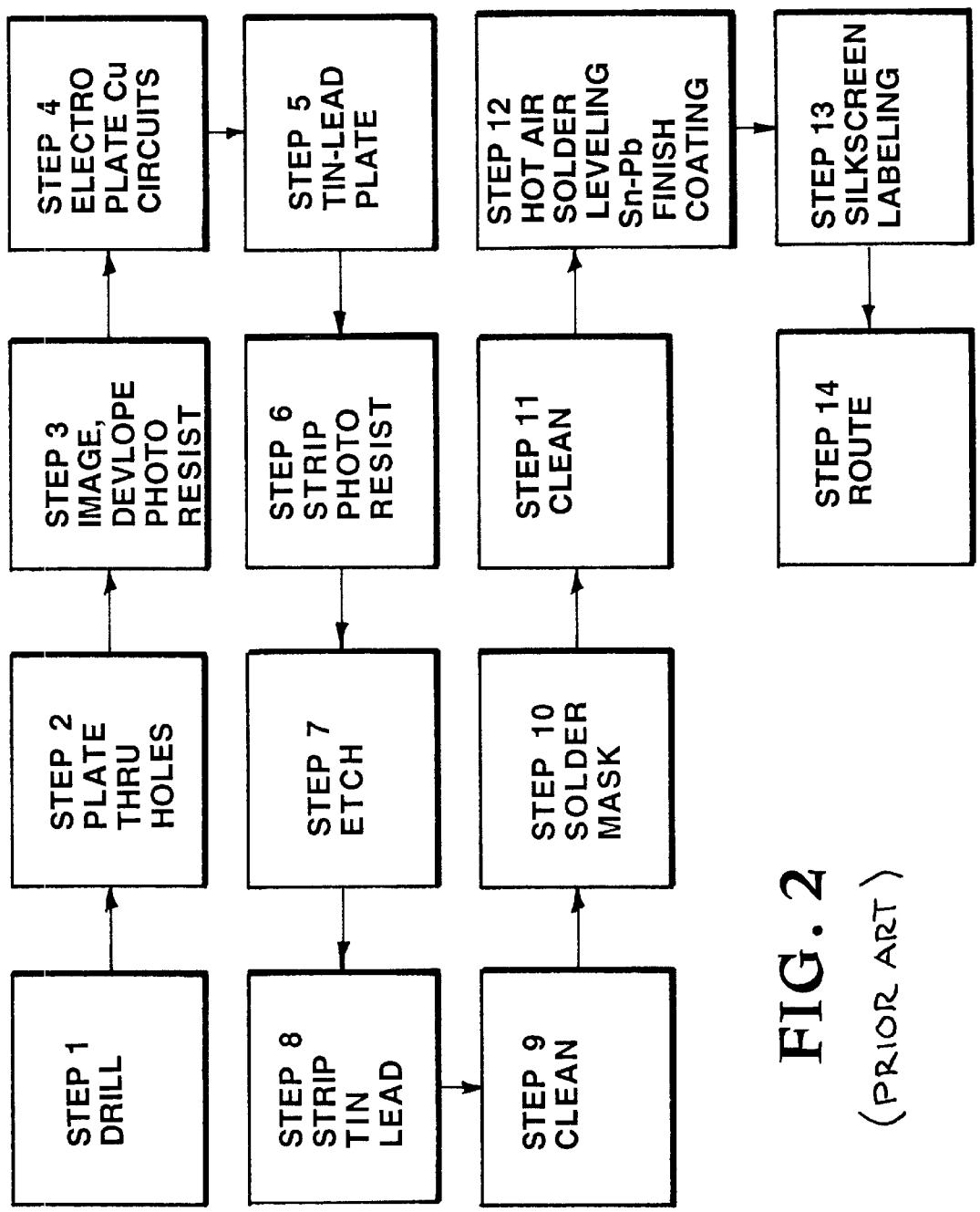
FIG. 2 shows a prior art plating process.

Referring now to FIG. 2 a prior art plating process is shown. The prior art process includes 14 individual steps. Step 1 is DRILL wherein the holes are drilled in the printed wiring board. Step 2 is Plate Thru Holes. Step 3 is IMAGE DEVELOP PHOTO RESIST. Step 4 is ELECTROPLATE CU CIRCUITS. Step 5 is TIN-LEAD PLATE. Step 6 is STRIP PHOTO RESIST. Step 7 is ETCH. Step 8 is STRIP TIN LEAD. Step 9 is CLEAN. Step 10 is SOLDER MASK. Step 11 is CLEAN. Step 12 is HOT AIR SOLDER LEVELING (Sn—Pb) FINISH COATING. Step 13 is SILK-SCREEN LABELING. Step 14 is ROUTE.

In an embodiment of the present invention one step is substituted for three steps of the prior art process. In the embodiment of the present invention a single bath process is used. The single bath process includes "plating Cu on the printed wiring board from a Ni/Cu bath using a low reduction potential conducted with high agitation conditions in said bath and plating Ni on the printed wiring board from a Ni/Cu bath using a high reduction potential conducted with low agitation conditions in said bath." This single bath process replaces the three steps of the prior art process identified in FIG. 2 as: Step 5 TIN-LEAD PLATE, Step 8 STRIP TIN LEAD, and Step 12 is HOT AIR SOLDER LEVELING (Sn—Pb) FINISH COATING.

This embodiment of the present invention provides a printed circuit board manufacturing technology which: reduces environmental risks associated with current technologies, especially risks from lead wastes, and improves production efficiency & profitability. The single bath process uses fewer manufacturing steps. The printed wiring board industry has low profit margins on many of its products. In the PWB process the "footprint," the total shop floor area needed for the process, determines some of overall cost of the process. The footprint area is an important limiting factor of production, and new technologies that even modestly reduce the footprint size can be very valuable.

Figure 3:
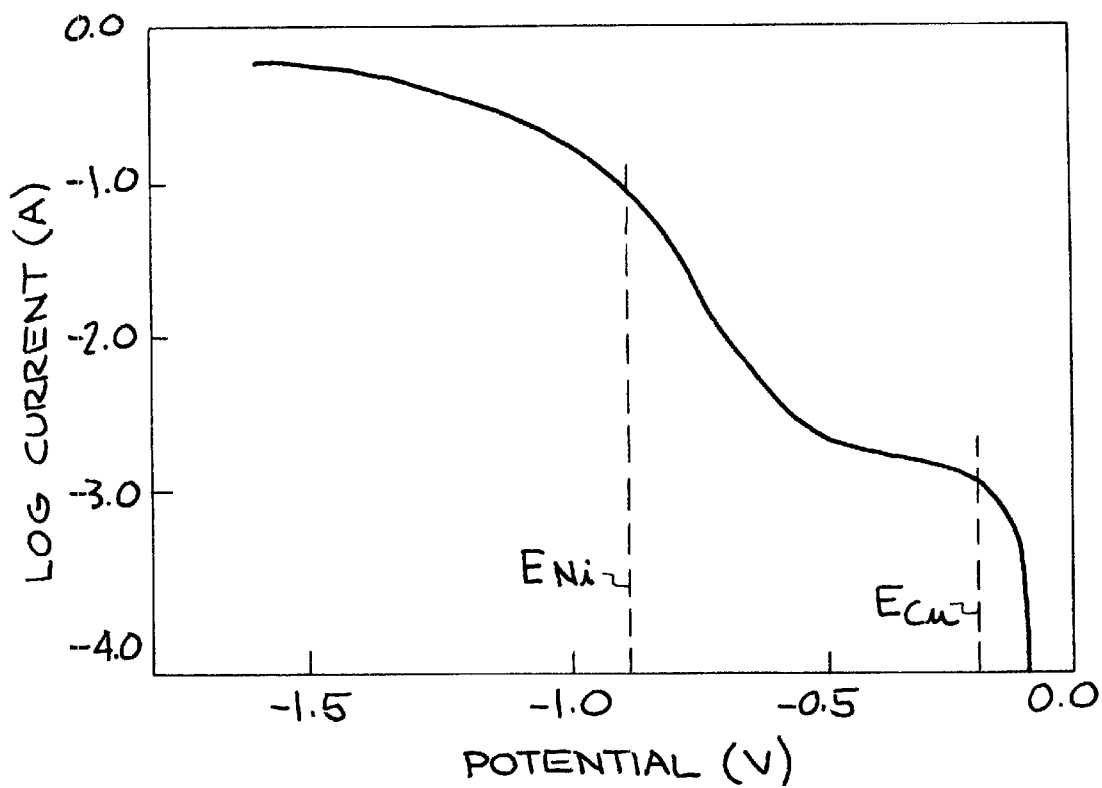
FIG. 3 illustrates the difference in reduction potential.

As shown by FIG. 3 the difference in reduction potential of Ni & Cu allows preferential plating of either metal. In the embodiment of the present invention the single bath process plating Cu on the printed wiring board from a Ni/Cu bath is conducted using a low reduction potential and the plating Ni on the printed wiring board from a Ni/Cu bath is conducted using a high reduction potential.

Referring again to FIG. 1 another embodiment of the single bath plating process will be described. In this embodiment of the invention a printed wiring board is processed using the four overall processing operations shown in FIG. 1. The four processing operations are (1) Normal Preparation of PWB, (2) Single Bath Plating Step 1, (3) Single Bath Plating Step 2, and (4) Final Processing of PWB. The "Normal Preparation of PWB" processing operation generally includes drilling holes, plating holes, and depositing the photoresist image circuitry.

In this embodiment of the invention the "Single Bath Plating Step 1 as will be described" involves plating copper and other metals on said printed wiring board from a bath containing nickel, copper, and other metals. The additional metals are included in the bath containing nickel and copper. The additional metals are included in the step of plating copper on the printed wiring board. The additional metals are alloyed with the copper and/or nickel to enhance conductivity, strength, and or corrosion resistance. The additional metals can be such metals as manganese, chromium, zinc, iron, cobalt, cadmium, tin, lead, arsenic, antimony, bismuth, gold and silver. A low reduction potential with high agitation conditions in the bath is used the Single Bath Plating Step 1.

In this embodiment of the invention the "Single Bath Plating Step 2 as will be described" involves plating nickel and other metals on the printed wiring board from a bath containing nickel, copper, and other metals. The additional metals are included in the bath containing nickel and copper and the additional metals are included in the step of plating on the printed wiring board. The additional metals are alloyed with the copper and/or nickel to enhance conductivity, strength, and or corrosion resistance. The additional metals can be such metals as manganese, chromium, zinc, iron, cobalt, cadmium, tin, lead, arsenic, antimony, bismuth, gold and silver. A high reduction potential with low agitation conditions in the bath is used in the Single Bath Plating Step 2.

They are deposited from the same solution to form the PWB. In development of the system of the embodiment present invention techniques were adapted from layered electroforming methods that are used to build up copper-nickel composite materials of high tensile strength. These materials typically have many alternating, extremely thin layers of each metal. The electroforming process parameters were altered so that the thicker layers of copper required for PWB circuitry could be deposited. The method of alternating layers may employ direct current (DC) and/or pulsed current (PC) under galvanometric or potentiometric control. The additional metals deposited may be alloyed with the copper and/or nickel, they may be present as alloys of themselves, or as distinct layers of metals.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of processing a printed wiring board by electrodeposition, comprising the steps of:

implementing initial processing steps on said printed wiring board, electrodepositing copper on said printed wiring board from a bath containing nickel and copper, electrodepositing nickel on said printed wiring board from said bath containing nickel and copper, and implementing final processing steps on said printed wiring board.

2. The method of claim 1 wherein additional metals are included in said bath containing nickel and copper and said additional metals are included with copper in said step of electrodepositing copper on said printed wiring board from said bath containing nickel and copper.

3. The method of claim 2 wherein said additional metals included in said bath containing nickel and copper and included with copper in said step of electrodepositing copper on said printed wiring board are manganese, chromium, zinc, iron, cobalt, cadmium, tin, lead, arsenic, antimony, bismuth, gold or silver.

4. The method of claim 1 wherein additional metals are included in said bath containing nickel and copper and said additional metals are included with nickel in said step of electrodepositing nickel on said printed wiring board from said bath containing nickel and copper.

5. The method of claim 4 wherein said additional metals included in said bath containing nickel and copper and included with nickel in said step of electrodepositing nickel on said printed wiring board are manganese, chromium, zinc, iron, cobalt, cadmium, tin, lead, arsenic, antimony, bismuth, gold or silver.

6. The method of claim 1 including the additional steps of building alternating layers on said printed wiring board by repeating said steps of implementing initial processing steps on said printed wiring board, electrodepositing copper on said printed wiring board from said bath containing nickel and copper, electrodepositing nickel on said printed wiring board from said bath containing nickel and copper, and implementing final processing steps on said printed wiring board.

7. The method of claim 6 wherein said steps are repeated more than 100 times.

8. The method of claim 1 wherein said step of:

electrodepositing copper on said printed wiring board from said bath containing nickel and copper is conducted using a low reduction potential.

9. The method of claim 8 wherein said step of:

electrodepositing copper on said printed wiring board from said bath containing nickel and copper using a low reduction potential is conducted with high agitation conditions in said bath.

10. The method of claim 1 wherein said step of electrodepositing nickel on said printed wiring board from said bath containing nickel and copper is conducted using a high reduction potential.

11. The method of claim 10 wherein said step of electrodepositing nickel on said printed wiring board from said bath containing nickel and copper using a high reduction potential is conducted with low agitation conditions in said bath.

12. The method of claim 1 wherein said step of:

electrodepositing copper on said printed wiring board from said bath containing nickel and copper is conducted using a low reduction potential and said step of electrodepositing nickel on said printed wiring board from said bath containing nickel and copper is conducted using a high reduction potential.

13. The method of claim 12 wherein said electrodepositing of copper on said printed wiring board from said bath containing nickel and copper using a low reduction potential is conducted with high agitation conditions in said bath and said step of electrodepositing nickel on said printed wiring board from said bath containing nickel and copper using a high reduction potential is conducted with low agitation conditions in said bath.

14. In a method of processing a printed wiring board by electrodeposition that includes implementing initial processing steps on said printed wiring board and implementing final processing steps on said printed wiring board, the improvement comprising the intermediate steps of:

electrodepositing Cu on said printed wiring board from a Ni/Cu bath, and electrodepositing Ni on said printed wiring board from said Ni/Cu bath.

15. The method of claim 14 wherein said step of:

electrodepositing Cu on said printed wiring board from a Ni/Cu bath is conducted using a low reduction potential.

16. The method of claim 15 wherein said step of:

electrodepositing Cu on said printed wiring board from a Ni/Cu bath using a low reduction potential is conducted with high agitation conditions in said bath.

17. The method of claim 14 wherein said step of electrodepositing Ni on said printed wiring board from said Ni/Cu bath is conducted using a high reduction potential.

18. The method of claim 17 wherein said step of electrodepositing Ni on said printed wiring board from said Ni/Cu bath using a high reduction potential is conducted with low agitation conditions in said bath.

19. The method of claim 14 wherein said step of:

electrodepositing Cu on said printed wiring board from said Ni/Cu bath is conducted using a low reduction potential and said step of electrodepositing Ni on said printed wiring board from said Ni/Cu bath is conducted using a high reduction potential.

20. The method of claim 19 wherein said step of electrodepositing Cu on said printed wiring board from said Ni/Cu bath using a low reduction potential is conducted with high agitation conditions in said bath and said step of electrodepositing Ni on said printed wiring board from said Ni/Cu bath using a high reduction potential is conducted with low agitation conditions in said bath.

21. A method of processing a printed wiring board by electrodeposition, comprising the steps of:

implementing initial processing steps on said printed wiring board, electrodepositing copper on said printed wiring board from a bath containing copper and nickel using a low reduction potential conducted with high agitation conditions in said bath, electrodepositing nickel on said printed wiring board from said bath containing copper and nickel using a high reduction potential conducted with low agitation conditions in said bath, and implementing final processing steps on said printed wiring board.

22. The method of claim 21 wherein additional metals are included in said bath containing nickel and copper and said additional metals are included with copper in said step of electrodepositing copper on said printed wiring board from said bath containing nickel and copper.

23. The method of claim 22 wherein said additional metals included in said bath containing nickel and copper and included with copper in said step of electrodepositing copper on said printed wiring board are manganese, chromium, zinc, iron, cobalt, cadmium, tin, lead, arsenic, antimony, bismuth, gold or silver.

24. The method of claim 21 wherein additional metals are included in said bath containing nickel and copper and said additional metals are included with nickel in said step of electrodepositing nickel on said printed wiring board from said bath containing nickel and copper.

25. The method of claim 23 wherein said additional metals included in said bath containing nickel and copper and included with nickel in said step of electrodepositing nickel on said printed wiring board are manganese, chromium, zinc, iron, cobalt, cadmium, tin, lead, arsenic, antimony, bismuth, gold or silver.

26. The method of claim 21 including the additional steps of building alternating layers on said printed wiring board by repeating said steps of implementing initial processing steps on said printed wiring board, electrodepositing copper on said printed wiring board from a bath containing copper and nickel, electrodepositing nickel on said printed wiring board from a bath containing copper and nickel, and implementing final processing steps on said printed wiring board.

27. The method of claim 26, wherein said steps are repeated more than 100 times.

* * * * *